(12) United States Patent
Chung et al.

(10) Patent No.: US 6,380,799 B1
(45) Date of Patent: Apr. 30, 2002

(54) INTERNAL VOLTAGE GENERATION CIRCUIT HAVING STABLE OPERATING CHARACTERISTICS AT LOW EXTERNAL SUPPLY VOLTAGES

(75) Inventors: Dae-hyun Chung; Jung-bae Lee, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/721,130

(22) Filed: Nov. 22, 2000

(30) Foreign Application Priority Data

Nov. 26, 1999 (KR) .......................................... 99-052999

(51) Int. Cl.[7] ................................................ G05F 1/10
(52) U.S. Cl. ...................................................... 327/543
(58) Field of Search ................................ 323/312, 313, 323/314, 315; 327/63, 319, 333, 538, 539, 540, 541, 543, 545, 546, 563

(56) References Cited

U.S. PATENT DOCUMENTS

| | | | | |
|---|---|---|---|---|
| 5,300,837 A | * | 4/1994 | Fischer ........................ 307/491 |
| 5,923,208 A | * | 7/1999 | Tasdighi et al. ............ 327/512 |
| 5,933,051 A | | 8/1999 | Tsuchida et al. ............ 327/543 |
| 5,945,821 A | * | 8/1999 | Sakurai et al. .............. 323/313 |

FOREIGN PATENT DOCUMENTS

| | | |
|---|---|---|
| JP | 6338188 | 12/1994 |
| JP | 8321189 | 12/1996 |

* cited by examiner

*Primary Examiner*—Jeffrey Zweizig
(74) *Attorney, Agent, or Firm*—Myers Bigel Sibley & Sajovec

(57) ABSTRACT

An internal voltage generation circuit is provided which can stably generate an internal supply voltage even if an external supply voltage decreases. The internal voltage generation circuit includes first and second level shifters, a differential amplifier and a driver. The first level shifter is connected to an internal supply voltage terminal and lowers the internal supply voltage to a predetermined voltage level. The second level shifter is connected to a reference voltage terminal and lowers a reference voltage to a predetermined voltage level. The differential amplifier compares the output voltage of the second level shifter with the output voltage of the first level shifter and amplifies the difference between the two output voltages. The driver generates the internal supply voltage in response to the output of the differential amplifier. The first and second level shifters may be source followers that decrease the internal supply voltage and the reference supply voltage, respectively, by a threshold voltage. Accordingly, the internal voltage generation circuit may stably generate the internal supply voltage even if the level of the external supply voltage is lowered, and restores the level of the internal supply voltage to its original level equal to the reference voltage even when the level of the internal supply voltage drops.

13 Claims, 8 Drawing Sheets

INTERNAL VOLTAGE GENERATION CIRCUIT HAVING STABLE OPERATING CHARACTERISTICS AT LOW EXTERNAL SUPPLY VOLTAGES

FIELD OF THE INVENTION

The present invention relates to an integrated circuit device, and more particularly, to integrated circuit devices having internal voltage generation circuits therein.

BACKGROUND OF THE INVENTION

As the integration density of integrated circuits continues to increase, the size of some elements present in those circuits, such as transistors, may decrease. However, as the size of some of the transistors present in those integrated circuits decreases, new methods for ensuring the stability of those integrated circuits may become necessary. For example, when the same external supply voltage is applied to both large and small transistors present in an integrated circuit memory device, electric fields within the integrated circuit memory device may cause smaller transistors to either malfunction or breakdown. This phenomenon may be prevented by decreasing an external supply voltage that is used to operate the memory device. To decrease the external supply voltage an internal voltage generation circuit may be used. Integrated circuit memory devices including these internal voltage generation circuits may exhibit improved stability while consuming less power in comparison to integrated circuit memory devices that use only an external supply voltage to control supply voltage.

FIG. 1 is a diagram showing a conventional internal voltage generation circuit. The internal voltage generation circuit includes a differential amplifier 10 and a driver 20. The differential amplifier 10 compares a reference voltage VREF with an internal supply voltage VINT, and generates an output voltage VA depending on the result of the comparison. The reference voltage VREF has a fixed voltage level with respect to an external supply voltage VCC. The driver 20 generates the internal supply voltage VINT in response to the output voltage VA of the differential amplifier 10.

During the operation of the internal voltage generation circuit, the internal supply voltage VINT is preferably set to have the same voltage level as the reference voltage VREF. When the internal supply voltage VINT is reduced to a level below the reference voltage VREF, the output voltage VA of the differential amplifier 10 is also lowered and the transistor MP2 of the driver 20 is turned on to a greater extent. Turning on MP2 to a greater extent operates to pull-up the internal supply voltage VINT signal line until the internal supply voltage VINT is equal to the reference voltage VREF. When the internal supply voltage VINT is equal to the reference voltage, the differential amplifier 10 achieves a quiescent operating point.

Transistors MN0 and MN1 preferably operate in a saturation region during operation of the differential amplifier 10. In other words, when the voltage level of the internal supply voltage VINT drops, for example, due to a load on the internal supply voltage VINT, the differential amplifier 10 restores the voltage level of the internal supply voltage VINT to the original voltage level, which is preferably equal to the reference voltage VREF.

However if VCC, VREF, and VINT are reduced in order to reduce power consumption, then the voltage VDS of the transistors MN0 and MN1 becomes smaller. This may cause the transistors MN0 and MN1, which are set to operate in a saturation region S1, to begin to operate in a linear region L1. As shown in the $I_{DS}$ vs. $V_{DS}$ curves of FIG. 2, when the voltage VDS of the transistors MN0 and MN1 becomes smaller, the operating points of the transistors MN0 and MN1 shift from the saturation region S1 into a linear region L1 of operation. The gain of the transistors MN0 and MN1 in the saturation region can be expressed as:

$$g_m = \frac{\partial I_{DS}}{\partial V_{GS}} \qquad (1)$$

Assuming that the gain of MN0, MN1 in the saturation region S1 is expressed as $g_{mS1}$, and that the gain in the linear region L1 is expressed as $g_{mL1}$, then the $g_{mS1} > g_{mL1}$ due to current $I_{DS}$ decreasing as the operating points of the transistors MN0 and MN1 shift to the linear region. However, the VDS may remain constant. Since the gain in the linear region is smaller, the differential amplifier 10 may not be capable of accurately adjusting VINT to match VREF during normal operating modes when the driver 20 is supplying current to the VINT signal line.

Accordingly, there is a need for internal voltage generation circuits that can generate a stable internal supply voltage at low external supply voltage without loss of gain in the differential amplifier stage of the internal voltage generation circuit.

SUMMARY OF THE INVENTION

Accordingly, the present invention provides internal voltage generation circuits which can steadily generate an internal supply voltage even if an external supply voltage decreases. A level shifter is connected to an internal supply voltage terminal. The level shifter lowers the internal supply voltage to a predetermined voltage level. A differential amplifier compares an output voltage of the internal voltage generation circuit to an output voltage of the level shifter and amplifies the difference between the two output voltages. A driver generates an internal supply voltage in response to an amplifier output of the differential amplifier. The internal voltage generation circuit preferably includes a second level shifter, which is connected to a reference voltage terminal. The second level shifter preferably lowers a reference voltage to a predetermined voltage level. In this case, the output voltage of the internal voltage generation circuit is an output voltage of the second level shifter. The differential amplifier may then compare the output voltage of the second level shifter to the output voltage of the first level shifter and amplify the difference between the two output voltages.

The first and second level shifters preferably comprise source followers and can decrease the internal supply voltage and the reference voltage, respectively, by a threshold voltage. More specifically, the first level shifter preferably includes a first transistor, in which an internal supply voltage is applied to the gate. The external supply voltage can be applied to the drain, and the source can be connected to the differential amplifier. A first current source may also be included, which is connected to the source of the first second transistor and ground. The second level shifter can include a second transistor in which the reference voltage can be applied to the gate. The external supply voltage may be applied to the drain, and the source can be connected to the differential amplifier. A second current source may be connected to the source of the second transistor and ground.

Internal voltage generation circuits according to the present invention may also include a current source controller for maintaining a constant current flowing in the current sources. The current source controller preferably includes a voltage bias unit for setting a predetermined voltage level, and a current mirror to which the external supply voltage can be applied. The current mirror determines the current volume of the current source based on the voltage level of the voltage bias unit.

According to other embodiments of the present invention internal voltage generators are provided that include a differential amplifier, a driver circuit, and a first level shifter circuit. The differential amplifier has first and second inputs. The driver circuit has an input electrically coupled to a first output of the differential amplifier, and an output electrically coupled to an internal voltage signal line. For example, the driver circuit can comprise a PMOS transistor having a gate electrode electrically connected to the first output of the differential amplifier and a drain electrically connected to the internal voltage signal line. The first level shifter circuit has an input electrically coupled to the internal voltage signal line, and an output electrically coupled to the first input of the differential amplifier. These internal voltage generators may also include a second level shifter circuit. Preferably, the second level shifter has an input electrically coupled to a reference voltage signal line and an output electrically coupled to the second input of said differential amplifier.

The first and second level shifter circuits may preferably comprise first and second source followers, respectively. For instance, the first source follower may include a first NMOS transistor and a current source. The first NMOS transistor preferably has a gate electrode electrically connected to the internal voltage signal line and a source electrically connected to the first input of the differential amplifier. The current source is preferably electrically connected to the source of the first NMOS transistor.

According to other embodiments of the present invention internal voltage generators are provided that include a differential amplifier, a PMOS transistor, and a first NMOS transistor, a first current source, a second NMOS transistor, and a second current source. The PMOS transistor preferably has a gate electrode electrically connected to a first output of said differential amplifier, a source electrically connected to a power supply signal line and a drain electrically connected to an internal voltage signal line. The first NMOS transistor preferably has a gate electrode electrically connected to the internal voltage signal line, a drain electrically connected to the power supply signal line and a source electrically connected to a first input of said differential amplifier. The first current source may have a first terminal electrically connected to the source of the first NMOS transistor. The second NMOS transistor preferably has a gate electrode electrically connected to a reference voltage signal line, a drain electrically connected to the power supply signal line and a source electrically connected to a second input of said differential amplifier. The second current source can have a first terminal electrically connected to the source of said second NMOS transistor. The generator may also include a current source controller electrically connected to second terminals of said first and second current sources, for example, a current mirror.

According to other embodiments of the present invention internal voltage generation circuits are provided that include a first level shifter, a differential amplifier, and a driver. The first level shifter can be connected to an internal supply voltage terminal that lowers an internal supply voltage to a predetermined voltage level. The differential amplifier may be connected to the first level shifter that comprises a reference voltage to an output voltage of the first level shifter and amplifies the difference between the reference voltage and the output voltage. The driver that preferably generates an internal supply voltage in response to an amplifier output of the differential amplifier. These internal voltage generation circuits may also include a second level shifter connected to a reference voltage terminal that lowers a reference voltage to a predetermined voltage level. In this case, the output voltage of the internal voltage generation circuit is an output voltage of the second level shifter. The differential amplifier compares the output voltage of the second level shifter to the output voltage of the first level shifter and amplifies the difference between the two output voltages. The first and second level shifters preferably decrease the internal supply voltage and the reference voltage, respectively, by a threshold voltage.

Each of the first and second level shifters can comprise a source follower. For instance, the first level shifter can include a second transistor and a second current source, while the second level shifter may include a first transistor and a first current source. In the first transistor, the reference voltage is applied to the gate, the external supply voltage is applied to the drain, and the source is connected to the differential amplifier. The first current source connected to the source of the transistor and ground. In the second transistor, the internal supply voltage is applied to the gate, the external supply voltage is applied to the drain, and the source is connected to e differential amplifier. The second current source is preferably connected to the source of the transistor and ground. These internal voltage generation circuits may further include a current source controller that maintains a constant current flowing in the first and second current sources. The current source controller preferably comprises a voltage bias unit that sets a predetermined voltage level, and a current mirror to which the external supply voltage is applied that determines the current volume of the current source based on the voltage level of the voltage bias unit.

The internal voltage generation circuit of the present invention can stably generate the internal supply voltage even if the level of the external supply voltage is lowered. The internal voltage generation circuit may also restore the level of the internal supply voltage to its original level equal to the reference voltage, even when the level of the internal supply voltage drops due to a load or when undershooting or overshooting occurs. In addition, the internal voltage generation circuit of the present invention can operate with a current consumption similar to conventional internal voltage generation circuits.

DETAILED DESCRIPTION

Figure 1:
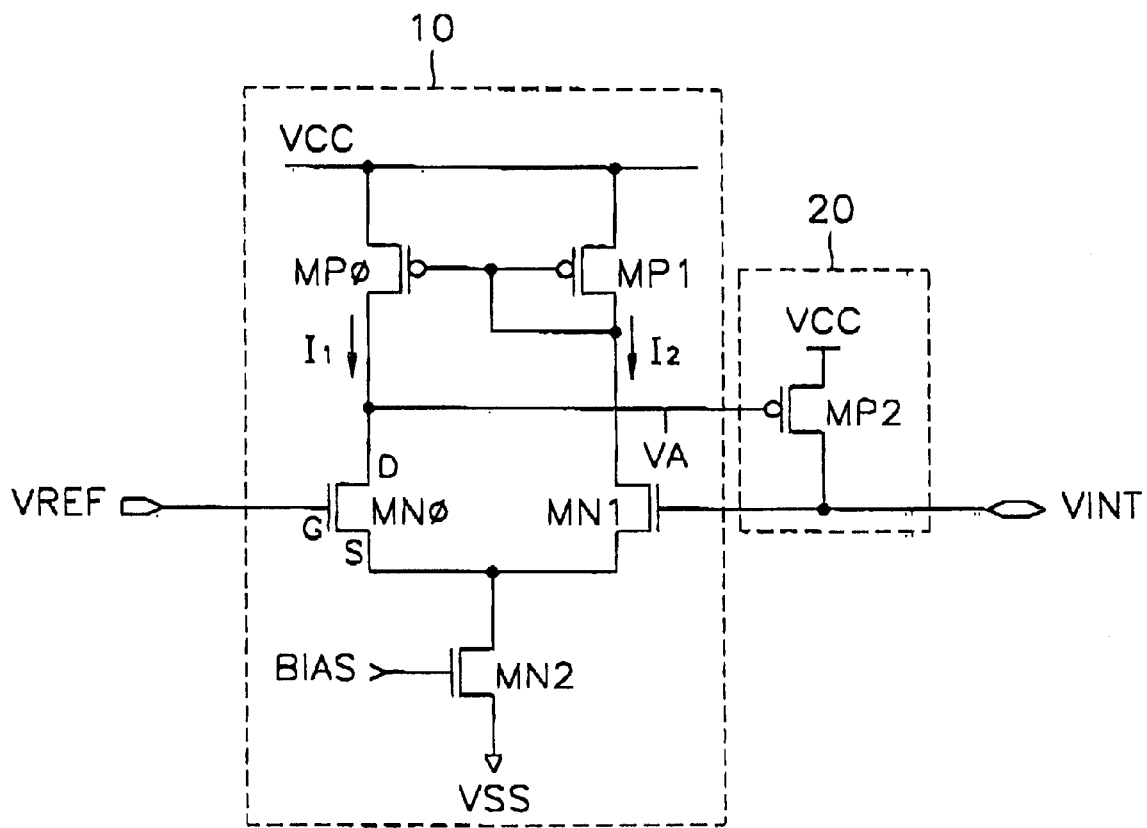
FIG. 1 is a schematic diagram showing a conventional internal voltage generation circuit.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. It is also noted that like reference numerals may be used to designate identical or corresponding parts throughout the drawings.

Other embodiments of the present invention internal voltage generators are provided that include a differential amplifier 10, a driver circuit 20, and a first level shifter 40 circuit. The differential amplifier 10 has first and second inputs. The driver circuit 20 has an input electrically coupled to a first output of the differential amplifier 10, and an output electrically coupled to an internal voltage signal line. For example, the driver circuit 20 can comprise a PMOS transistor MP2 having a gate electrode electrically connected to the first output of the differential amplifier 10 and a drain electrically connected to the internal voltage signal line VINT. The first level shifter circuit 40 has an input electrically coupled to the internal voltage signal line VINT, and an output electrically coupled to the first input of the differential amplifier 10. These internal voltage generators may also include a second level shifter circuit 30. Preferably, the second level shifter 30 has an input electrically coupled to a reference voltage signal line and an output electrically coupled to the second input of the differential amplifier 10.

The first and second level shifter circuits 40, 30 may preferably comprise first and second source followers 40, 30, respectively. For instance, the first source follower 40 may include a first NMOS transistor MN4 and a current source C2. The first NMOS transistor MN4 preferably has a gate electrode electrically connected to the internal voltage signal line VINT and a source electrically connected to the first input of the differential amplifier 10. The current source C2 is preferably electrically connected to the source of the first NMOS transistor MN4.

Figure 3:
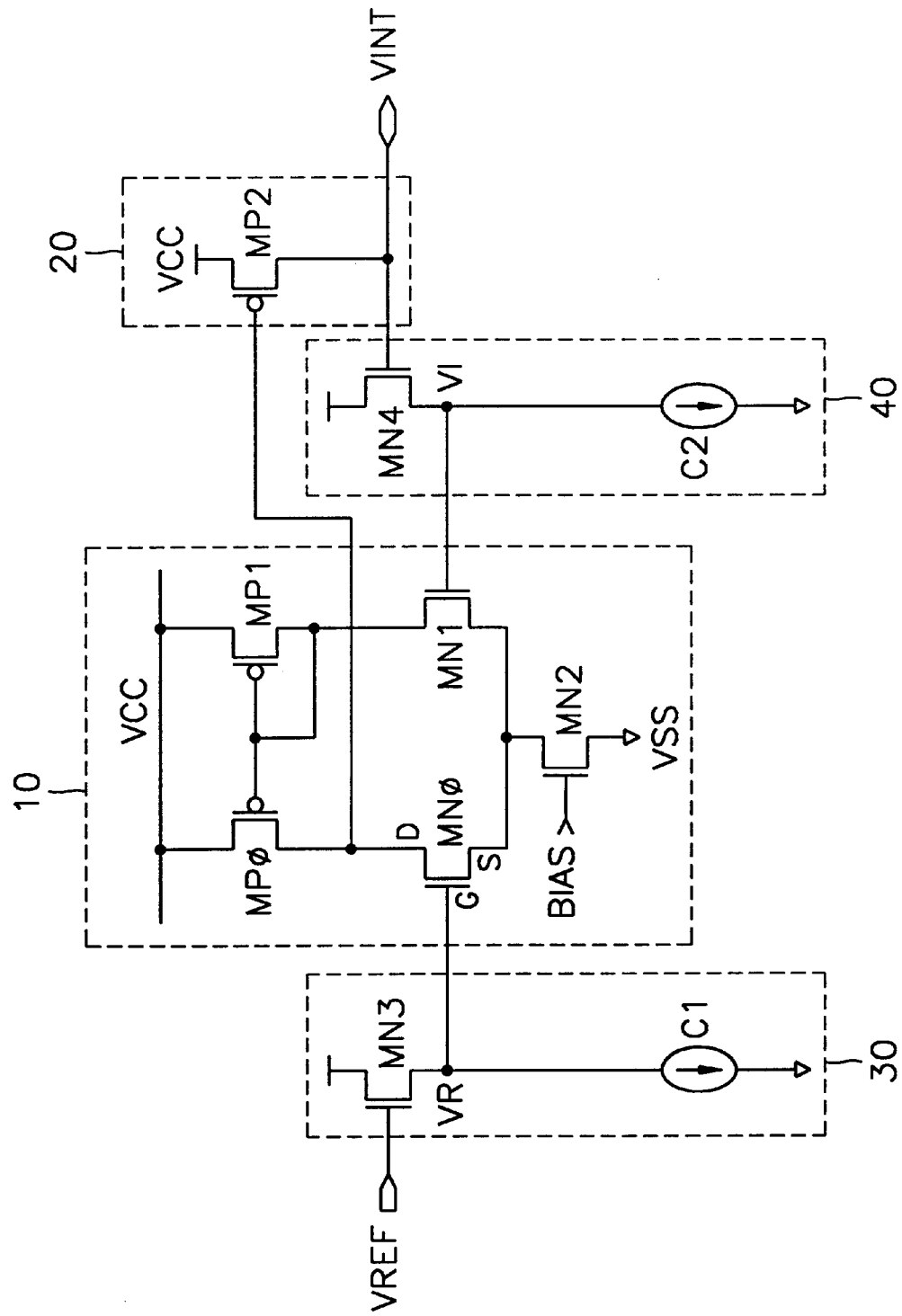
FIG. 3 is a schematic diagram showing an internal voltage generation circuit according to an embodiment of the present invention.

Referring now to FIG. 3, shown is an internal voltage generation circuit according to an embodiment of the present invention. The internal voltage generation circuit can include source followers 30 and 40 connected to a reference voltage VREF terminal and an internal supply voltage VINT terminal, respectively, in addition to the differential amplifier 10, and the driver 20 shown in FIG. 1. The source followers 30 and 40 respectively include transistors MN3 and MN4 controlled by the reference voltage VREF and the internal supply voltage VINT, respectively, and connected to current sources C1 and C2, respectively, as illustrated.

The source follower 30 can operate according to the relationship shown in Equation (2) below, $$VREF = Vth_{MN3} + VR \quad (2)$$

where $Vth_{MN3}$ is the threshold voltage of the transistor MN3. Stated differently, the voltage VR applied to the gate of the transistor MN0 preferably corresponds to the value obtained by subtracting the voltage $Vth_{MN3}$ from the reference voltage VREF. Similarly Equation (3) defines the relationship between the internal supply voltage VINT, the threshold voltage of transfer $Vth_{MN4}$, and the voltage VI, with the source follower 40 added to the internal voltage generation circuit:

$$VINT = Vth_{MN4} + VI \quad (3)$$

where $Vth_{MN4}$ is the threshold voltage of the transistor MN4. Thus, the voltage VI applied to the gate of the transistor MN1 preferably corresponds to the value obtained by subtracting the voltage $Vth_{MN4}$ from the internal supply voltage VINT. The voltages VR and VI are applied to the inputs of the differential amplifier 10. In contrast to the conventional internal voltage generation circuit shown in FIG. 1, the inputs to the differential amplifier 10, VR and VI, can be lower than both the reference voltage VREF and the internal supply voltage VINT, by the threshold voltages Vth of the transistors MN3 and MN4, respectively. As a result, the gate-source voltage $V_{GS}$ of each of the transistors MN0 and MN1 can decrease. Since the gate-source voltage $V_{GS}$ partially determines the gain of the differential amplifier 10, the source followers 30 and 40 may act as level shifters. Therefore, referring back to FIG. 2, the operating points of the transistors MN0 and MN1 are shifted from the linear region L1 to the saturation region S2 by decreasing gate-source voltages $V_{GS}$ of the transistors MN0 and MN1.

Moreover, the variation of the current IDS for a given gate-source voltage $V_{GS}$ is larger in the saturation region S2 than in the linear region L1. In other words, $$g_{mS2} > g_{mL1} \quad (4)$$

Accordingly, by decreasing the gate-source voltage $V_{GS}$ of the transistors MN0, MN1, the gain can be increased such that the transistors MN0 and MN1 now operate in the saturation region instead of the linear region. Since the operating points of the transistors MN0 and MN1 have been shifted into the saturation region S2, the differential amplifier 10 may operate "more dynamically" despite a lower $V_{DS}$ voltage which results from a lower external supply voltage VCC.

Figure 4:
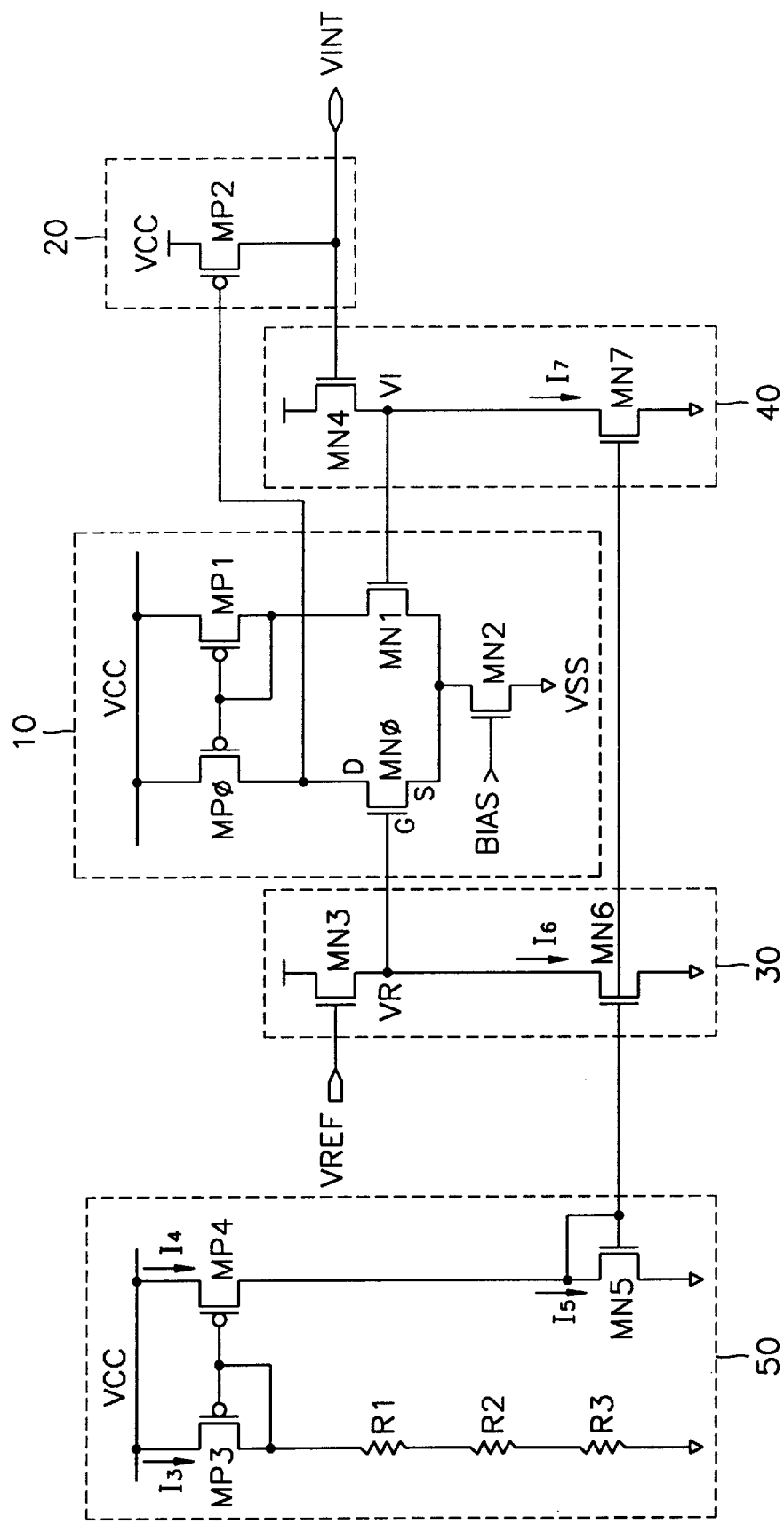
FIG. 4 is a schematic diagram showing an embodiment of the internal voltage generation circuit of FIG. 3.

Referring now to FIG. 4 shown is another example of an internal voltage generation circuit similar to that shown in FIG. 3. In these embodiments, the current sources C1 and C2 of the source followers 30 and 40 of shown in FIG. 3 are replaced by transistors MN6 and MN7, respectively. The internal voltage generation circuit of FIG. 4 also includes a current source controller 50 for controlling the transistors MN6 and MN7. The current source controller 50 includes transistors MP3 and MP4 constructing a current mirror, resistors R1, R2 and R3 connected to the transistor MP3 in series, and a transistor MN5 which is connected to the transistor MP4. Transistor MN5 sets the magnitude of the current in transistors MN6 and MN7.

The resistors R1, R2 and R3 form a voltage bias unit for determining the current in the transistor MP3 which acts as a current source of the current mirror. Instead of using resistor devices, devices capable of fixing the gate voltage of the transistor MP3, for example, diodes, may be used.

In the operation of the internal voltage generation circuit of FIG. 4, currents $I_3$ and $I_4$ flowing through the transistors MP3 and MP4, respectively, are preferably the same. Moreover, a current $I_5$ flowing through the transistor MN5, which is connected in series with the transistor MP4, is the same as the current $I_4$. This can be expressed as $$I_3 = I_4 = I_5 \quad (5)$$

The transistor MN5 acts as a current source, and the transistors MN5, MN6 and MN7 construct a current mirror.

Therefore, the current 15 flowing through the transistor MN5 is the same as the currents $I_6$ and $I_7$ flowing through the transistors MN6 and MN7, respectively. In other words, $$I_5 = I_6 = I_7 \tag{6}$$

combining Equations (5) and (6), equation (7) established that:

$$I_3 = I_4 = I_5 = I_6 = I_7 \tag{7}$$

This means that the current source controller 50 maintains a constant current flowing through the transistors MN6 and MN7, which are the current sources in the source followers 30 and 40, respectively.

As described above in conjunction with FIG. 3, the voltages VR and VI of the respective source followers 30 and 40, are applied to the gates of the transistors MN0 and MN1. The voltage levels of VR and VI are lower than the reference voltage VREF and the internal supply voltage VINT, respectively, by the threshold voltage Vth. Accordingly, even if the external supply voltage VCC decreases, the internal voltage generation circuit can stably operate by compensating for the gain of the differential amplifier 10.

Internal voltage generators according to the present invention may include, for example, a differential amplifier 10, a PMOS transistor, and a first NMOS transistor MN4, a first current source C1, a second NMOS transistor MN3, and a second current source C2. The PMOS transistor preferably has a gate electrode electrically connected to a first output of the differential amplifier 10, a source electrically connected to a power supply signal line VCC, and a drain electrically connected to an internal voltage signal line VINT. The first NMOS transistor MN4 preferably has a gate electrode electrically connected to the internal voltage signal line VINT, a drain electrically connected to the power supply signal line VCC and a source electrically connected to a first input of the differential amplifier 10. The first current source may have a first terminal electrically connected to the source of the first NMOS transistor. The second NMOS transistor preferably has a gate electrode electrically connected to a reference voltage signal line, a drain electrically connected to the power supply signal line and a source electrically connected to a second input of the differential amplifier 10. The second current source can have a first terminal electrically connected to the source of the second NMOS transistor. The generator may also include a current source controller 50 electrically connected to second terminals of the first and second current sources, for example, a current mirror.

The internal voltage generation circuits may include a first level shifter 40, a differential amplifier 10, and a driver 20. The first level shifter 40 can be connected to an internal supply voltage terminal that lowers an internal supply voltage to a predetermined voltage level. The differential amplifier 10 may be connected to the first level shifter 40 that compares a reference voltage to an output voltage of the first level shifter 40 and amplifies the difference between the reference voltage VREF and the output voltage. The driver 20 that preferably generates an internal supply voltage VINT in response to an amplifier output of the differential amplifier 10. These internal voltage generation circuits may also include a second level shifter 30 connected to a reference voltage VREF terminal that lowers a reference voltage VREF to a predetermined voltage level. In this case, the output voltage of the internal voltage generation circuit is an output voltage of the second level shifter 30. The differential amplifier 10 compares the output voltage of the second level shifter 30 to the output voltage of the first level shifter 40 and amplifies the difference between the two output voltages. The first and second level shifters preferably decrease the internal supply voltage VINT and the reference voltage VREF, respectively, by a threshold voltage.

Each of the first and second level shifters can comprise a source followers 30, 40. For instance, the first level shifter 40 can include a second transistor MN4 and a second current source C2, while the second level shifter 30 may include a first transistor MN3 and a first current source C1. In the first transistor MN3, the reference voltage VREF is applied to the gate, the external supply voltage VCC is applied to the drain, and the source is connected to the differential amplifier 10. The first current source C1 connected to the source of the transistor MN3. In the second transistor MN4, the internal supply voltage VINT is applied to the gate, the external supply voltage VCC is applied to the drain, and the source is connected to a differential amplifier 10. The second current source C2 is preferably connected to the source of the transistor MN4. These internal voltage generation circuits may further include a current source controller 50 that maintains a constant current flowing in the first and second current sources C1,C2. The current source controller 50 preferably comprises a voltage bias unit that sets a predetermined voltage level, and a current mirror to which the external supply voltage VCC is applied that determines the current volume of the current source based on the voltage level of the voltage bias unit.

To quantify the improvement provided by the internal voltage generation circuits of the present invention, results of computer simulations of the internal voltage generation circuits shown in FIGS. 1 and 4 will now be discussed with reference to FIGS. 5 through 10.

Figure 2:
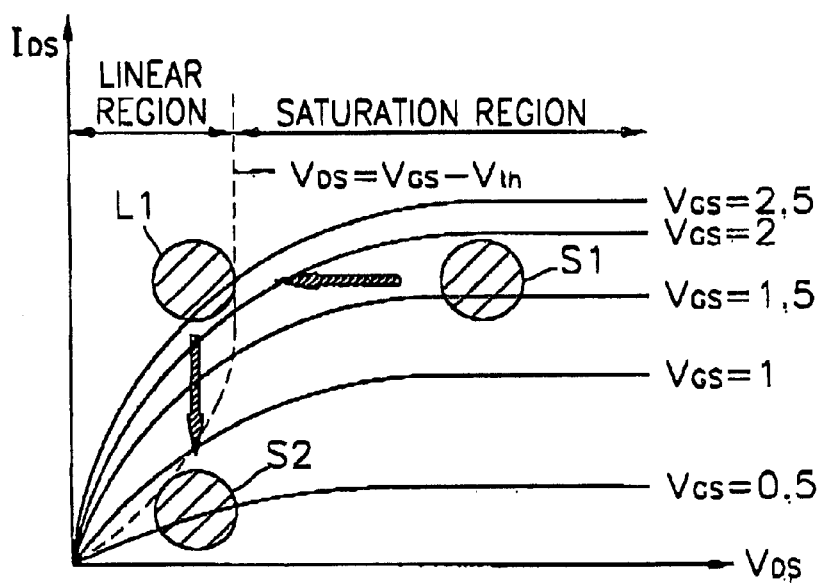
FIG. 2 is a graph showing the operating regions of transistors within the differential amplifier of FIG. 1.
Figure 5:
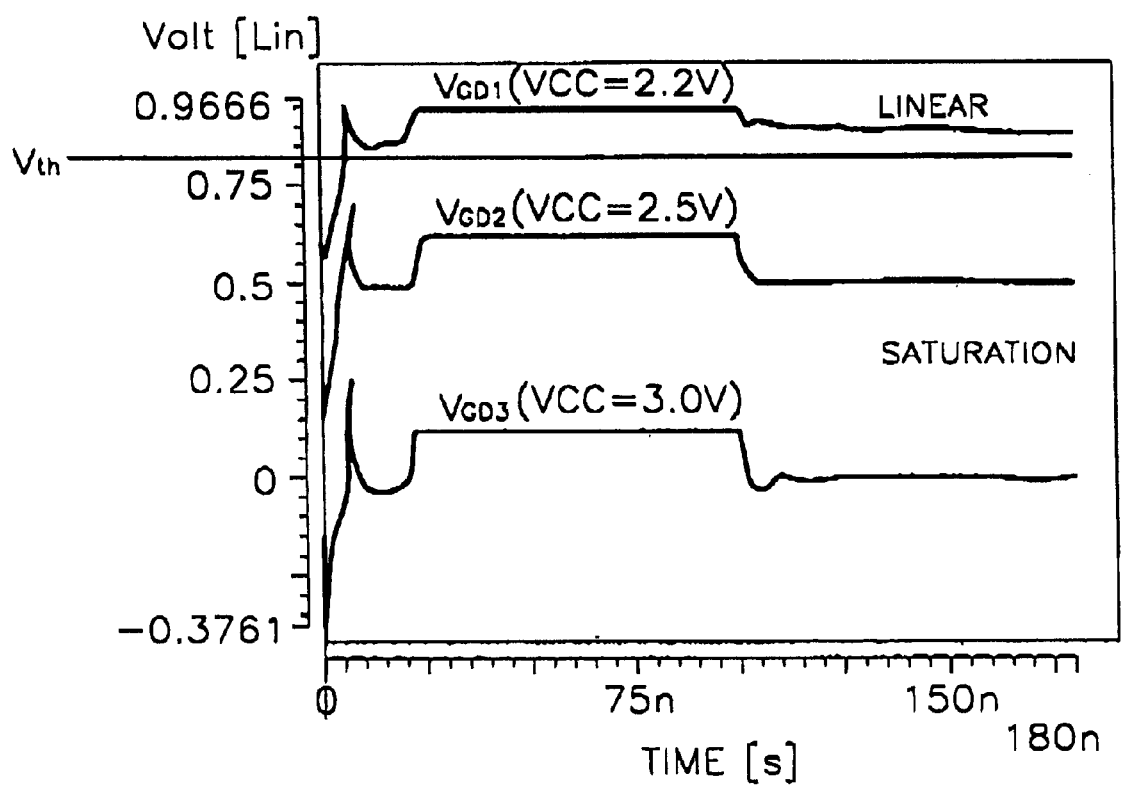
FIG. 5 shows the results of a computer simulation of a transistor within the differential amplifier of FIG. 1.

Referring now to FIG. 5, shown are results of a simulation of the operating region of the transistor MN0 of the internal voltage generation circuit shown in FIG. 1. FIG. 5 shows the change in the gate-drain voltage $V_{GD}$ of the transistor MN0 when the external supply voltage VCC is lowered, for example, from VCC=3.0 V to IVCC=2.2 V. When VCC=3.0 V and VCC=2.5 V, voltages $V_{GD3}$ and $V_{GD2}$ were lower than the threshold voltage Vth of the transistor MN0, which means that the transistor MN0 is operating in a saturation region. On the other hand, when VCC=2.2 V, voltage $V_{GD1}$ was higher than the threshold voltage Vth, which means that the transistor MN0 is operating in a linear region. Thus, the operating point of the transistor MN0 can shift from the saturation region to the linear region as the external supply voltage VCC decreased.

Figure 6:
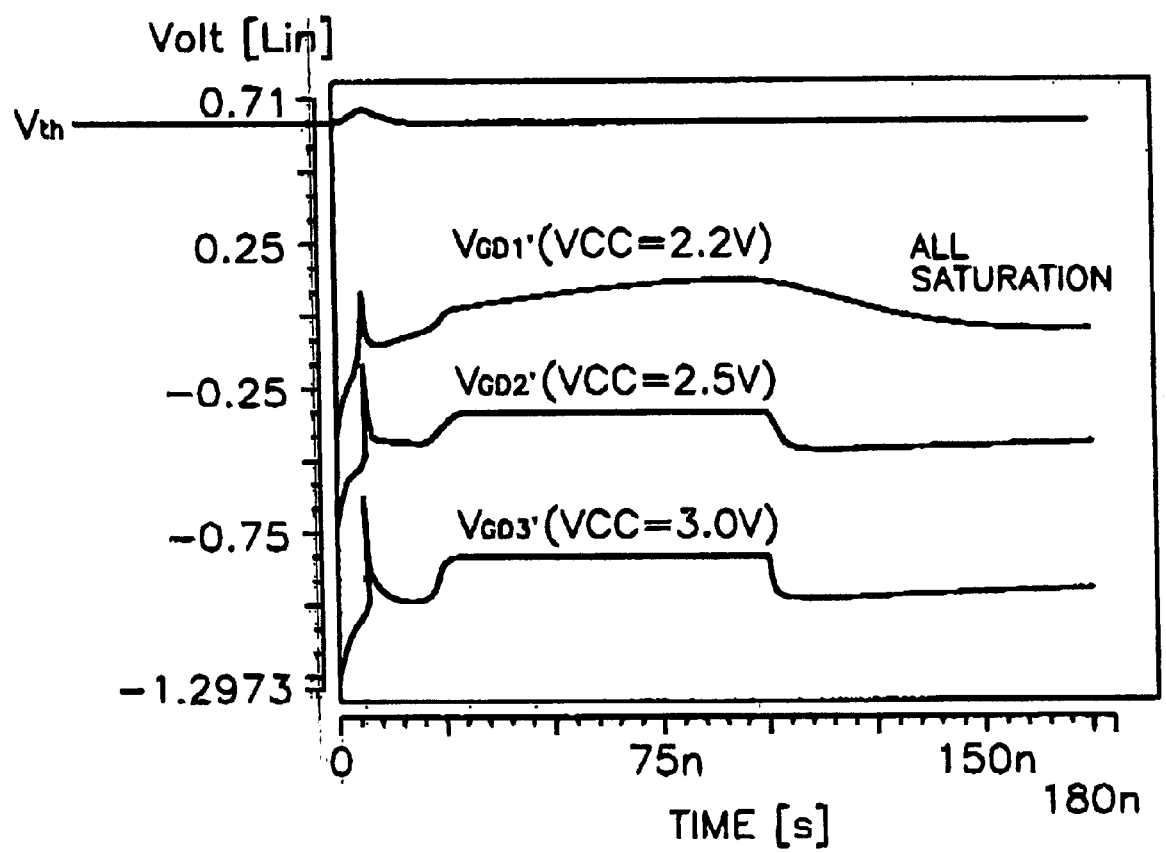
FIG. 6 shows the results of a computer simulation of a transistor within the differential amplifier of FIG. 4.

FIG. 6 shows the results of a simulation of the operating region of the transistor MN0 of the internal voltage generation circuit shown in FIG. 4. Similar to FIG. 5, FIG. 6 shows the change in the gate-drain voltage $V_{GD}$ of the transistor MN0 when the external supply voltage VCC is lowered, for example, from VCC=3.0 V to VCC=2.2 V. However, when the internal voltage generation circuit shown in FIG. 4 is simulated, even though the external supply voltage VCC is lowered from 3.0 V to 2.2 V, the voltage $V_{GD}$ of the transistor MN0 of FIG. 4 can be lower than the threshold voltage Vth of the transistor MN0. Thus, the transistor MN0 may operate in the saturation region despite a decreasing external supply voltage VCC.

Figure 7:
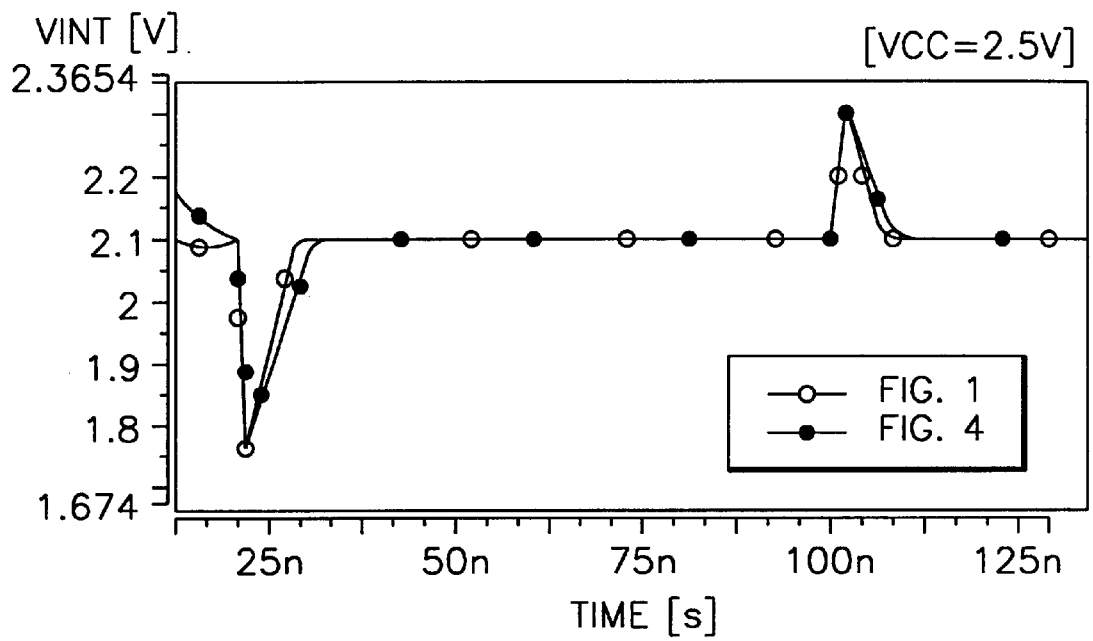
FIGS. 7 through 9 show the results of computer simulations of the internal voltage generation circuits of FIGS. 1 and 4 at different external supply voltages.
Figure 8:
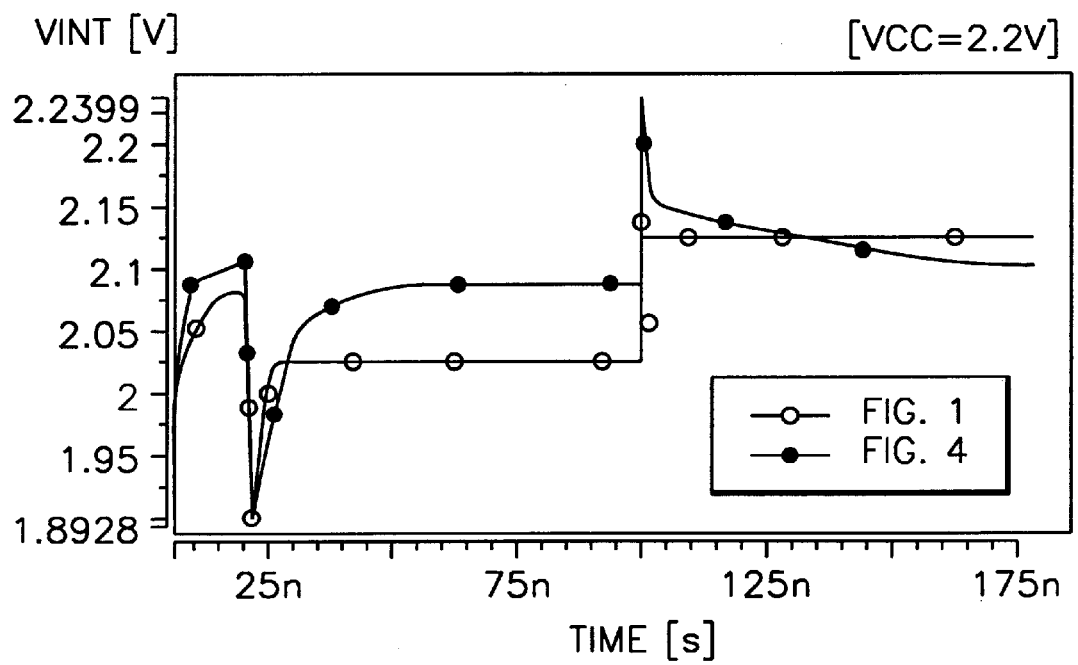
Figure 9:
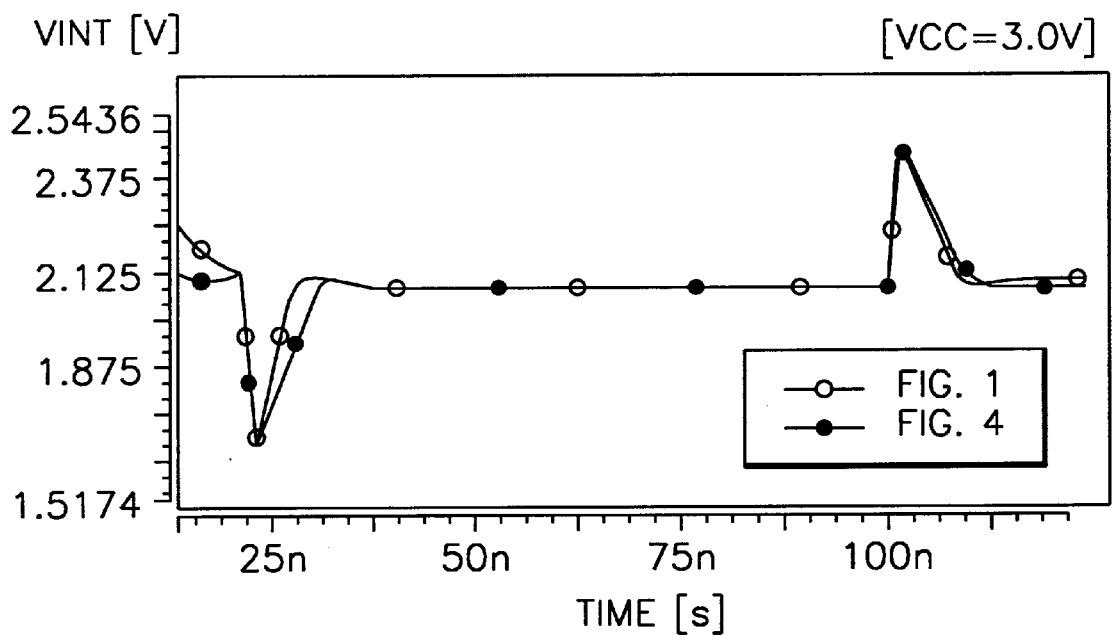

FIGS. 7 through 9 show simulation results of the internal voltage generation circuits of FIGS. 1 and 4 as the external supply voltage VCC changes.

In particular, FIG. 7 shows the internal supply voltages VINT generated, when the external supply voltage VCC is 2.5 V in normal operation. As shown in FIG. 7, the plot (represented by --) of the internal supply voltage VINT of FIG. 1 is almost identical to the plot (represented by --) of the internal supply voltage VINT of FIG. 4, each having a voltage level of 2.1 V. Here, the internal supply voltage VINT is 2.1 V in each case since the reference voltage VREF was previously set to 2.1 V.

On the other hand, FIG. 8 shows the levels of the internal supply voltages VINT generated in the internal voltage generation circuits of FIGS. 1 and 4, respectively, when the external supply voltage VCC is 2.2 V. Here, the level of the internal supply voltage VINT of FIG. 4 is similar to the voltage level of 2.1 V appearing when VCC=2.5 V in FIG. 7. However, the level of the internal supply voltage VINT of FIG. 1 is much lower than the voltage level of 2.1 V. This means that the operating point of each of the transistors MN0 and MN1 of FIG. 1 shifted to a linear region as the external supply voltage VCC decreased. Thus, the internal voltage generation circuit of FIG. 1 will not operate properly due to a decrease in gain. As a result, the internal voltage generation circuit of FIG. 1 can not restore the internal supply voltage VINT to the reference voltage VREF when the level of the internal supply voltage VINT decreased. This can be due to, for example, a load on the internal supply voltage VINT, or undershooting/overshooting.

FIG. 9 shows the levels of the internal supply voltages VINT generated in the internal voltage generation circuits of FIGS. 1 and 4, respectively, when the external supply voltage VCC is 3.0 V. Here, the levels of the internal supply voltages VINT are almost the same as the voltage of 2.1 V appearing when VCC=2.5 V in FIG. 7. This means that when the external supply voltage VCC increases higher than 2.5 V in normal operation, the internal voltage generation circuits of FIGS. 1 and 4 steadily operate in a normal state.

Figure 10:
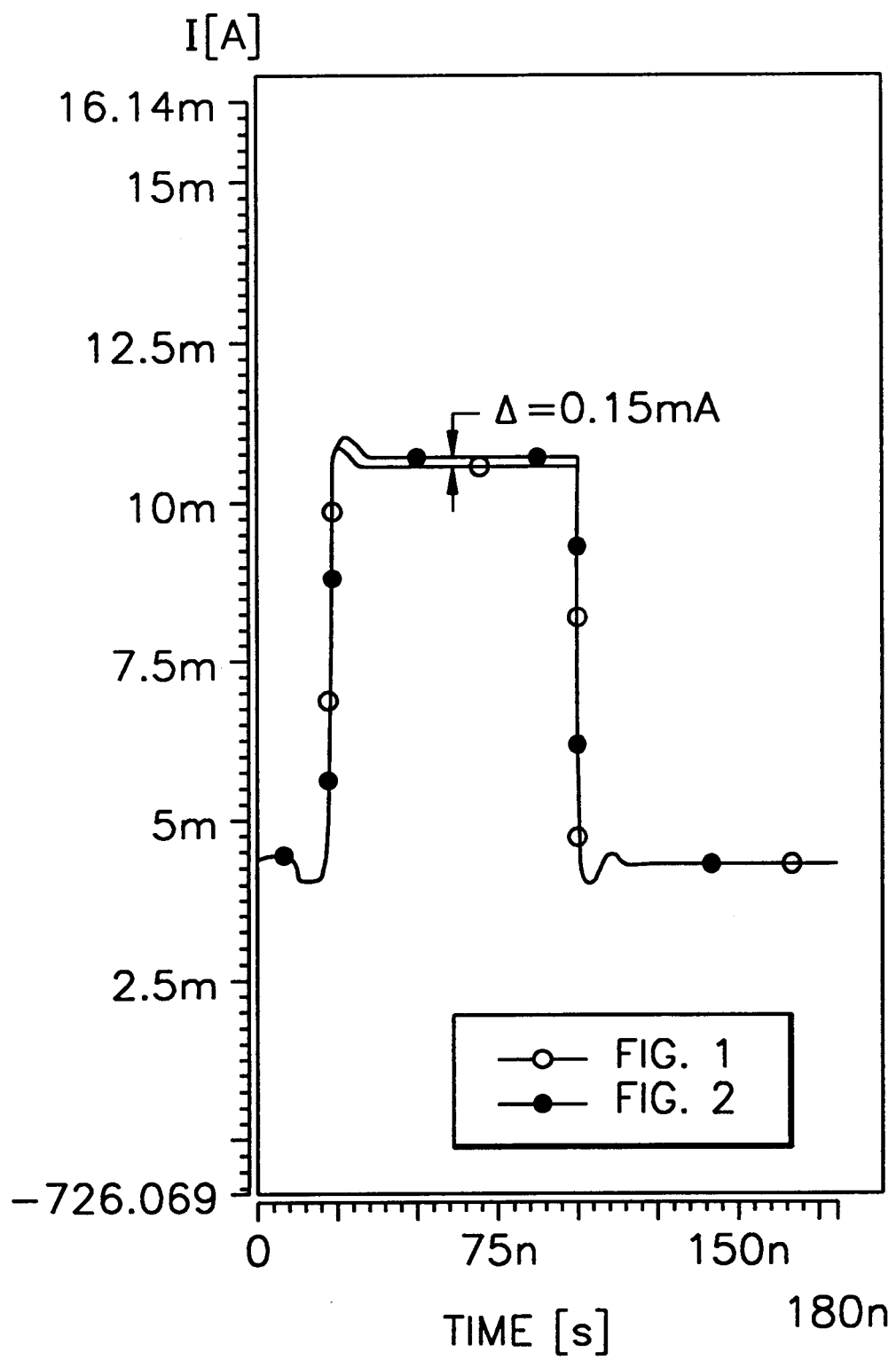
FIG. 10 shows the consumption of current in a computer simulation of the internal voltage generation circuits of FIGS. 1 and 4.

FIG. 10 shows the current consumption of the internal voltage generation circuits of FIGS. 1 and 4. As shown in FIG. 10, the difference between the current consumption of FIG. 1 and the current consumption of FIG. 4 is about 0.15 mA. Thus, the increase in current consumption of FIG. 4 compared to the current consumption of FIG. 1 may be less than or equal to 1%. As a result, the current consumption of the internal voltage generation circuit of FIG. 4 does not increase appreciably even though the internal voltage generation circuit of FIG. 4 includes more stages than the internal voltage generation circuit of FIG. 1. This is because most of the current in the internal voltage generation circuits of FIGS. 1 and 4 is consumed by the driver 20.

In summary, the internal voltage generation circuits according to the present invention steadily generate the internal supply voltage VINT even if the level of the external supply voltage VCC is lowered, and also restores the level of the internal supply voltage VINT to the reference voltage VREF even when the level of the internal supply voltage VINT drops due to a load, or when undershooting or overshooting occurs. In addition, the internal voltage generation circuits according to the present invention operate with a current consumption similar to conventional internal voltage generation circuits.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An internal voltage generator, comprising:
   a differential amplifier having first and second inputs;
   a driver circuit having an input electrically coupled to a first output of said differential amplifier and an output electrically coupled to an internal voltage signal line; and
   a first level shifter circuit having an input electrically coupled to the internal voltage signal line and an output electrically coupled to the first input of said a differential amplifier in such a manner that enables independent control of the first and second inputs of said differential amplifier.

2. The generator of claim 1, further comprising:
   a second level shifter circuit having an input electrically coupled to a reference voltage signal line and an output electrically coupled to the second input of said differential amplifier.

3. An internal voltage generator, comprising:
   a differential amplifier having first and second inputs;
   a driver circuit having an input electrically coupled to a first output of said differential amplifier and an output electrically coupled to an internal voltage signal line;
   a first level shifter circuit having an input electrically coupled to the internal voltage signal line and an output electrically coupled to the first input of said differential amplifier; and
   a second level shifter circuit having an input electrically coupled to a reference voltage signal line and an output electrically coupled to the second input of said differential amplifier;
   wherein said driver circuit comprises a PMOS transistor having a gate electrode electrically connected to the first output of said differential amplifier and a drain electrically connected to the internal voltage signal line.

4. An internal voltage generator, comprising:
   a differential amplifier having first and second inputs;
   a driver circuit having an input electrically coupled to a first output of said differential amplifier and an output electrically coupled to an internal voltage signal line;
   a first level shifter circuit having an input electrically coupled to the internal voltage signal line and an output electrically coupled to the first input of said differential amplifier; and
   a second level shifter circuit having an input electrically coupled to a reference voltage signal line and an output electrically coupled to the second input of said differential amplifier;
   wherein said first and second level shifter circuits comprise first and second source followers, respectively.

5. The generator of claim 4, wherein said first source follower comprises:
   a first NMOS transistor having a gate electrode electrically connected to the internal voltage signal line, a drain electrically connected to a power supply voltage and a source electrically connected to the first input of said differential amplifier; and
   a current source electrically connected to the source of said first NMOS transistor.

6. An internal voltage generator, comprising:
   a differential amplifier;
   a PMOS transistor having a gate electrode electrically connected to a first output of said differential amplifier, a source electrically connected to a power supply signal line and a drain electrically connected to an internal voltage signal line;

a first NMOS transistor having a gate electrode electrically connected to the internal voltage signal line, a drain electrically connected to the power supply signal line and a source electrically connected to a first input of said differential amplifier;

a first current source having a first terminal electrically connected to the source of said first NMOS transistor;

a second NMOS transistor having a gate electrode electrically connected to a reference voltage signal line, a drain electrically connected to the power supply signal line and a source electrically connected to a second input of said differential amplifier; and a second current source having a first terminal electrically connected to the source of said second NMOS transistor.

7. The generator of claim 6, further comprising a current source controller electrically connected to second terminals of said first and second current sources.

8. The generator of claim 7, wherein said current source controller comprises a current mirror.

9. An internal voltage generator circuit, comprising:

a level shifter connected to an internal supply voltage terminal, that lowers an internal supply voltage to a predetermined voltage level;

a differential amplifier connected to the level shifter that comprises a reference voltage to an output voltage of the level shifter and amplifies the difference between the reference voltage and the output voltage; and a driver that generates an internal supply voltage in response to an amplifier output of the differential amplifier;

a second level shifter connected to a reference voltage terminal, that lowers a reference voltage to a predetermined voltage level;

wherein the output voltage of in the internal voltage generation circuit is an output voltage of the second level shifter.

wherein the differential amplifier compares the output voltage of the second level shifter to the output voltage of the first level shifter and amplifies the difference between the two output voltages; and wherein each of the first and second level shifters comprises a source follower.

10. An internal voltage generator circuit, comprising:

a level shifter connected to an internal supply voltage terminal, that lowers an internal supply voltage to a predetermined voltage level;

a differential amplifier connected to the level shifter that comprises a reference voltage to an output voltage of the level shifter and amplifies the difference between the reference voltage and the output voltage; and a driver that generates an internal supply voltage in response to an amplifier output of the differential amplifier;

a second level shifter connected to a reference voltage terminal, that lowers a reference voltage to a predetermined voltage level;

wherein the output voltage of in the internal voltage generation circuit is an output voltage of the second level shifter;

wherein the differential amplifier compares the output voltage of the second level shifter to the output voltage of the first level shifter and amplifies the difference between the two output voltages; and wherein the first and second level shifters decrease the internal supply voltage and the reference voltage, respectively, by a threshold voltage.

11. An internal voltage generator circuit, comprising:

a level shifter connected to an internal supply voltage terminal, that lowers an internal supply voltage to a predetermined voltage level;

a differential amplifier connected to the level shifter that comprises a reference voltage to an output voltage of the level shifter and amplifies the difference between the reference voltage and the output voltage; and a driver that generates an internal supply voltage in response to an amplifier output of the differential amplifier;

a second level shifter connected to a reference voltage terminal, that lowers a reference voltage to a predetermined voltage level;

wherein the output voltage of in the internal voltage generation circuit is an output voltage of the second level shifter.

12. The internal voltage generation circuit of claim 11, wherein the first level shifter comprises:

a second transistor in which the internal supply voltage is applied to the gate, the external supply voltage is applied to the drain, and the source is connected to e differential amplifier; and a second current source connected to the source of the transistor and ground.

13. The internal voltage generation circuit of claim 12, further comprising a current source controller that maintains a constant current flowing in the first and second current sources, wherein the current source controller comprises:

a voltage bias unit that sets a predetermined voltage level; and a current mirror to which the external supply voltage is applied that determines the current volume of the current source based on the voltage level of the voltage bias unit.

* * * * *